United States Patent
Wang

(10) Patent No.: US 11,309,378 B2
(45) Date of Patent: Apr. 19, 2022

(54) METHOD OF MANUFACTURING FLEXIBLE DISPLAY

(71) Applicant: WUHAN CHINA STAR OPTOELECTRONICS SEMICONDUCTOR DISPLAY TECHNOLOGY CO., LTD., Hubei (CN)

(72) Inventor: Shuai Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/753,807

(22) Filed: Apr. 6, 2020

(65) Prior Publication Data
US 2021/0134922 A1 May 6, 2021

(30) Foreign Application Priority Data
Oct. 31, 2019 (CN) .......................... 201911050418.2

(51) Int. Cl.
*H01L 27/32* (2006.01)
*H01L 51/00* (2006.01)
*H01L 51/56* (2006.01)

(52) U.S. Cl.
CPC ...... *H01L 27/3276* (2013.01); *H01L 51/0097* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 10,673,001 | B2 * | 6/2020 | Niu | H01L 51/0097 |
| 2014/0097408 | A1 * | 4/2014 | Kim | H01L 27/3276 257/40 |
| 2018/0166019 | A1 * | 6/2018 | Lee | G09G 3/3225 |
| 2019/0140025 | A1 | 5/2019 | Wang | |
| 2019/0235682 | A1 | 8/2019 | Choi et al. | |
| 2019/0273213 | A1 * | 9/2019 | Niu | H01L 27/124 |
| 2019/0280075 | A1 * | 9/2019 | Chung | H01L 51/5203 |
| 2019/0334105 | A1 * | 10/2019 | Choi | H01L 51/56 |

(Continued)

FOREIGN PATENT DOCUMENTS

CN 106653815 A 5/2010
CN 107482046 A 12/2017
(Continued)

*Primary Examiner* — J. E. Schoenholtz
(74) *Attorney, Agent, or Firm* — Mark M. Friedman

(57) ABSTRACT

A method of manufacturing flexible display is disclosed. The method includes the steps of: providing a substrate, wherein the substrate includes a display area and a bending area; forming an inorganic layer on the substrate; etching the inorganic layer of the bending area of the substrate, and replacing the inorganic layer with a first organic layer; forming a metal wiring layer on the first organic layer; patterning the metal wiring layer; and forming a second organic layer on the metal wiring layer. By utilizing the method of manufacturing flexible display, the risk of metal wiring peeling and cracking during the bending process of the flexible display is reduced.

14 Claims, 8 Drawing Sheets

(56) References Cited

U.S. PATENT DOCUMENTS

| | | | | |
|---|---|---|---|---|
| 2019/0363153 A1* | 11/2019 | Matsui | .................. | H05B 33/02 |
| 2019/0363154 A1* | 11/2019 | Kaneko | ................ | H01L 51/003 |
| 2020/0013970 A1* | 1/2020 | Wang | ................ | H01L 27/3276 |
| 2020/0150725 A1* | 5/2020 | Saitoh | ................ | H01L 51/0097 |
| 2020/0341516 A1* | 10/2020 | Huang | ................ | G06F 1/1637 |

FOREIGN PATENT DOCUMENTS

| | | |
|---|---|---|
| CN | 109449163 A | 3/2019 |
| CN | 109494314 A | 3/2019 |
| CN | 109671354 A | 4/2019 |

* cited by examiner

METHOD OF MANUFACTURING FLEXIBLE DISPLAY

CROSS REFERENCE TO RELATED APPLICATIONS

The present application claims priority to Chinese Patent Application No. 201911050418.2, entitled "METHOD OF MANUFACTURING FLEXIBLE DISPLAY", and filed on Oct. 31, 2019, the entire disclosure of which is incorporated herein by reference.

FIELD OF INVENTION

The present disclosure relates to a method of manufacturing flexible display, and more particularly, to a method of manufacturing a bending area of a flexible display.

BACKGROUND OF INVENTION

Active matrix organic light-emitting diode (AMOLED) panels use independent thin-film transistors to control each pixel, so that each pixel can be continuously and independently driven to emit light. The driving method includes the use of low temperature polysilicon or oxide thin film transistors. Accordingly, the advantages thereof include low driving voltages and long service lifespan of the light-emitting units.

Compared with the traditional light-emitting diode (LCD) panels, the AMOLED panels have the characteristics of fast response times, high contrast, and wide viewing angles, etc. In addition, the AMOLED panels also have the characteristics of self-luminance. That is, backlight modules can be omitted in the AMOLED panels. Thus, the AMOLED panels are thinner than the traditional LCD panels, and the cost of the backlight modules can be saved.

Full screen display smartphones have become the current development trend of mobile phones. Increasing the screen-to-body ratios of mobile phones has become a research hotspot for various display manufacturers. For the flexible AMOLED displays, the panel bending technology can effectively reduce the bottom bezels of the mobile phones, so as to increase the screen-to-body ratios of the mobile phones, and is the mainstream of the technologies currently applied.

Technical Problems

FIG. 1 is a schematic view of an AMOLED panel, including a display area A1 and a bending area B1. The formation of the bending area of the AMOLED panel can reduce the bottom bezel of the panel. Since the AMOLED panel is provided with metal wires in the bending area, the metal wires may be broken due to excessive stress generated during the bending process, so that the signals of the flexible printed circuit board and the driver IC cannot be transmitted to the display area, resulting in failure of a part of the display area. In addition, the panel bending process belongs to a back-end manufacturing process of the module. The front-end processing may be in vain if the problem occurs to the back-end manufacturing process.

Accordingly, it is necessary to provide a method of manufacturing flexible display to solve the problems existing in the prior art.

SUMMARY OF INVENTION

Technical Solutions

In view of this, the present disclosure provides a method of manufacturing flexible display to reduce the risk of metal wiring peeling and cracking in a bending area of a panel.

In order to achieve the aforementioned object of the present disclosure, the present disclosure provides a method of manufacturing flexible display, comprising the following steps:

providing a substrate, including coating polyimide solution on a glass and curing the polyimide solution to obtain a polyimide film, wherein the substrate includes a display area and a bending area;

forming an inorganic layer on the substrate;

etching the inorganic layer of the bending area of the substrate, and replacing the inorganic layer with a first organic layer;

forming a metal wiring layer on the first organic layer;

patterning the metal wiring layer; and forming a second organic layer on the metal wiring layer.

In one embodiment of the present disclosure, the metal wiring layer includes at least one protruding portion, and the protruding portion is protrudingly disposed in the second organic layer.

In one embodiment of the present disclosure, the protruding portion of the metal wiring layer is circular, oval, rectangular, square, or rhombic.

In one embodiment of the present disclosure, material of the first organic layer is selected from polyimide.

In one embodiment of the present disclosure, material of the second organic layer is selected from polyimide.

In one embodiment of the present disclosure, a thickness of the first organic layer ranges from 1 to 10 um.

In one embodiment of the present disclosure, a thickness of the second organic layer ranges from 1 to 10 um.

In order to achieve the aforementioned object of the present disclosure, another embodiment of the present disclosure provides a method of manufacturing flexible display, comprising the following steps:

providing a substrate, wherein the substrate includes a display area and a bending area;

forming an inorganic layer on the substrate;

etching the inorganic layer of the bending area of the substrate, and replacing the inorganic layer with a first organic layer;

forming a metal wiring layer on the first organic layer;

patterning the metal wiring layer; and forming a second organic layer on the metal wiring layer.

In one embodiment of the present disclosure, the metal wiring layer includes at least one protruding portion, and the protruding portion is protrudingly disposed in the second organic layer.

In one embodiment of the present disclosure, the protruding portion of the metal wiring layer is circular, oval, rectangular, square, or rhombic.

In one embodiment of the present disclosure, material of the first organic layer is selected from polyimide.

In one embodiment of the present disclosure, material of the second organic layer is selected from polyimide.

In one embodiment of the present disclosure, a thickness of the first organic layer ranges from 1 to 10 um.

In one embodiment of the present disclosure, a thickness of the second organic layer ranges from 1 to 10 um.

Another embodiment of the present disclosure provides a flexible display having a display area and a bending area, the bending area comprising:

a substrate;

a first organic layer disposed on the substrate;

a metal wiring layer disposed on the first organic layer; and a second organic layer disposed on the metal wiring layer.

In one embodiment of the present disclosure, the metal wiring layer includes at least one protruding portion, and the protruding portion is protrudingly disposed in the second organic layer.

Beneficial Effect

Compared with the prior art, by using the organic layer instead of the inorganic layer, the hardness of the bending area is decreased, the stress during the bending process is reduced, and the metal wiring layer may be protected by the second organic layer. In addition, a portion of the patterned metal wiring layer protruding from other portions of the patterned metal wiring layer increases the contact area with the second organic layer, thereby reducing the risk of metal wiring peeling and cracking during the bending process.

DESCRIPTION OF DRAWINGS

In order to more clearly illustrate the technical solutions in the embodiments or the prior art, the following drawings, which are intended to be used in the description of the embodiments or the prior art, will be briefly described. It is obvious that the drawings and the following description are only some embodiments of the present disclosure. Those of ordinary skill in the art may, without creative efforts, derive other drawings from these drawings.

DETAILED DESCRIPTION OF PREFERRED EMBODIMENTS

The following embodiments are referring to the accompanying drawings for exemplifying specific implementable embodiments of the present disclosure. Furthermore, directional terms described by the present disclosure, such as "upper", "lower", "top", "bottom", "front", "back", "left", "right", "inner", "outer", "side", "around", "center", "horizontal", "lateral", "vertical", "longitudinal", "axial", "radial", "uppermost" or "lowermost", etc., are only directions by referring to the accompanying drawings. Thus, the used directional terms are used to describe and understand the present disclosure, but the present disclosure is not limited thereto.

Figure 1:
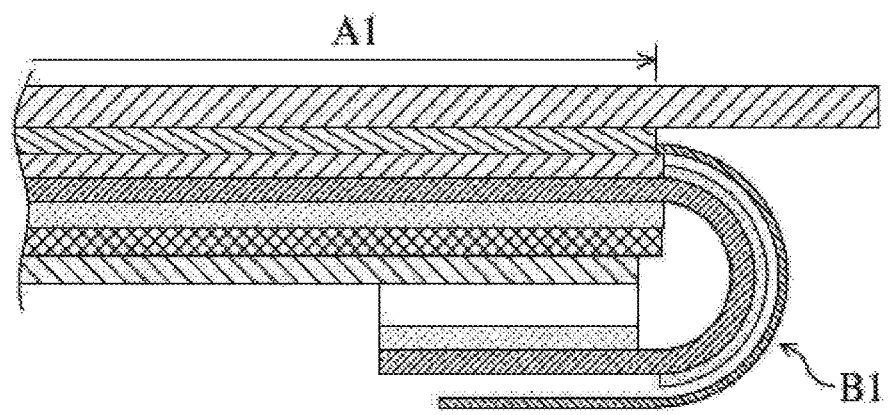
FIG. 1 is a schematic view of a bent flexible AMOLED panel in the prior art.
Figure 2:
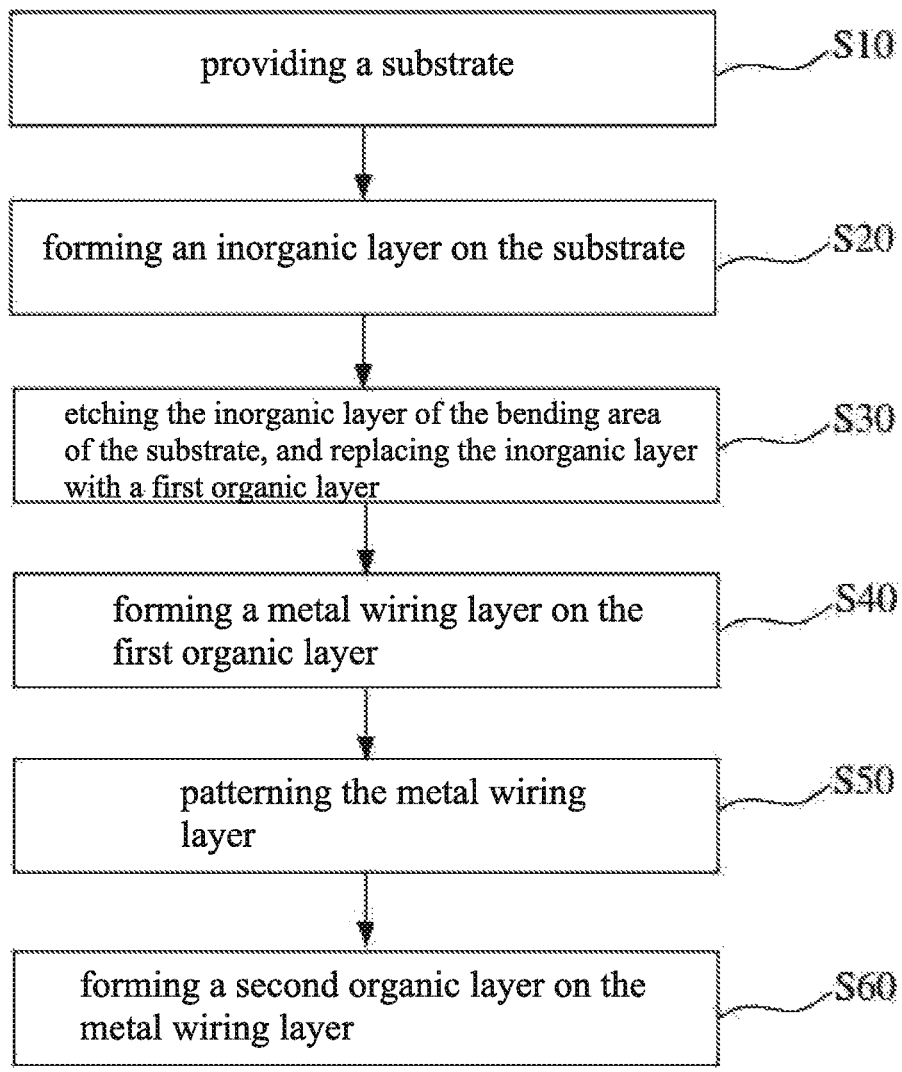
FIG. 2 is flow-chart of a method of manufacturing flexible display according to an embodiment of the present disclosure.

Please refer to FIG. 2. A method of manufacturing flexible display according to an embodiment of the present disclosure comprises the following steps:

S10: providing a substrate, wherein the substrate includes a display area and a bending area. Specifically, in the step, the method includes coating polyimide solution on a glass and curing the polyimide solution to obtain a polyimide film.

S20: forming an inorganic layer on the substrate;

S30: etching the inorganic layer of the bending area of the substrate, and replacing the inorganic layer with a first organic layer. Specifically, material of the first organic layer is selected from polyimide. A thickness of the first organic layer ranges from 1 to 10 um. Alternatively, the thickness of the first organic layer ranges from 1 to 9 um, 1 to 8 um, 1 to 7 um, 1 to 6 um, 1 to 5 um, 1 to 4 um, or 1 to 3 um. Since the material of the organic layer is softer than that of the inorganic layer, the overall hardness of the bending area can be reduced by replacing the inorganic layer with the organic layer, so as to reduce the stress during the bending process.

S40: forming a metal wiring layer on the first organic layer;

S50: patterning the metal wiring layer. Specifically, the metal wiring layer includes a plurality of metal wires, and each metal wire corresponds to a corresponding signal to transmit a signal. The metal wiring layer may be formed with at least one protruding portion by etching, and the protruding portion is protrudingly disposed in the second organic layer to increase a contact area with the second organic layer, thereby reducing the risk of metal wiring peeling and cracking. Alternatively, the protruding portion of the metal wiring layer is circular, oval, rectangular, square, or rhombic.

S60: forming a second organic layer on the metal wiring layer for protecting the metal wiring layer. Specifically, material of the second organic layer is selected from polyimide. A thickness of the second organic layer ranges from 1 to 10 um. Alternatively, the thickness of the second organic layer ranges from 1 to 9 um, 1 to 8 um, 1 to 7 um, 1 to 6 um, 1 to 5 um, 1 to 4 um, or 1 to 3 um.

Figure 3:
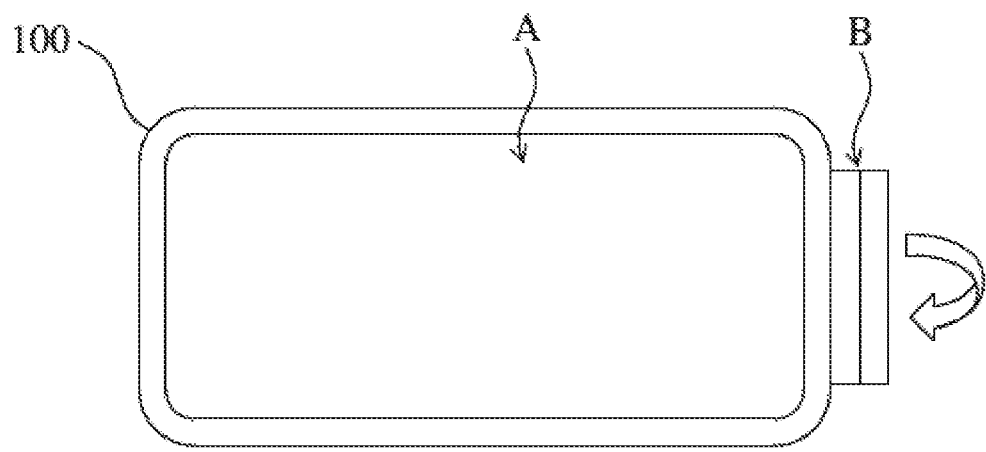
FIG. 3 is a schematic view of a flexible display according to an embodiment of the present disclosure.

Please refer to FIG. 3. The present disclosure further provides a flexible display 100 manufactured by using the method mentioned above. The flexible display 100 includes a display area A and a bending area B.

Figure 4A:
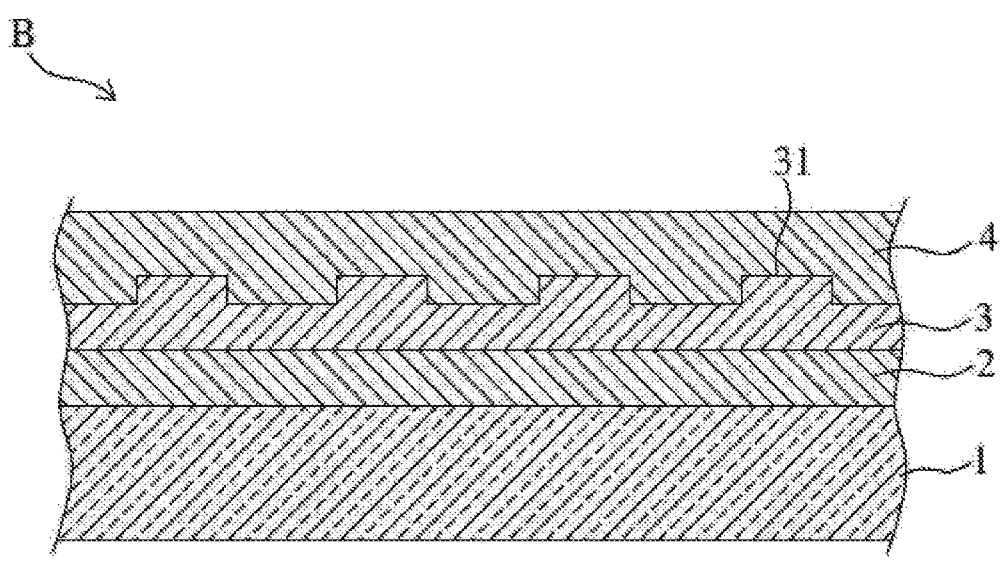
FIG. 4A is a schematic view of a bending area of a flexible display according to an embodiment of the present disclosure.

As shown in FIG. 4A, the bending area B includes a substrate 1 coated with polyimide, a first organic layer 2, a metal wiring layer 3, and a second organic layer 4. The first organic layer 2 is disposed on the substrate 1, the metal wiring layer 3 is disposed on the first organic layer 2, and the second organic layer 4 is disposed on the metal wiring layer 3 for protecting the metal wiring layer 3. The metal wiring layer 3 includes at least one protruding portion 31 which is protrudingly disposed in the second organic layer 2.

Figure 4B:
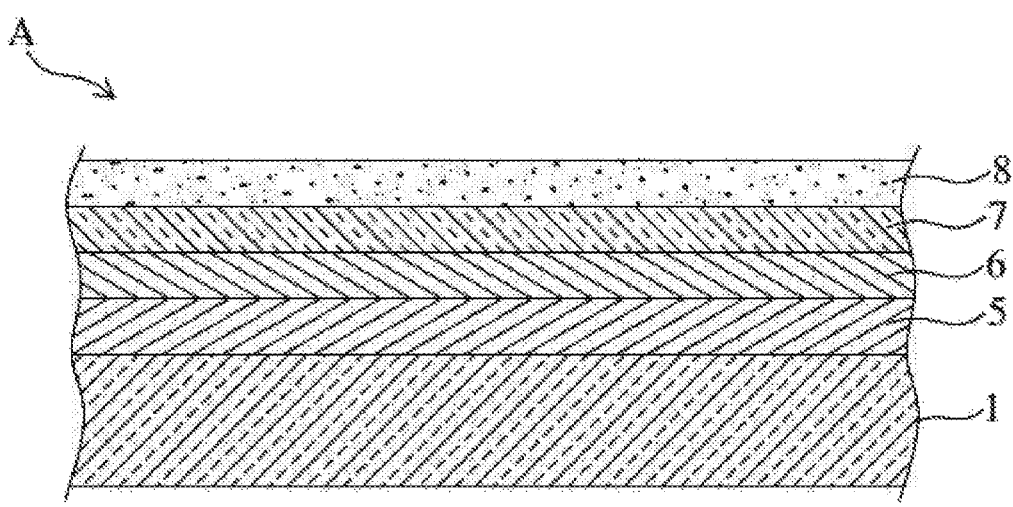
FIG. 4B is a schematic view of a display area of a flexible display according to an embodiment of the present disclosure.

As shown in FIG. 4B, the schematic structure of the display area A of the flexible display 100 is further described. The display area A includes a substrate 1 coated with polyimide, an inorganic layer 5, a thin-film transistor layer 6, an electroluminescent layer 7, and an encapsulation layer 8 from bottom to top.

The first organic layer 2 of the substrate 1 in FIG. 4A is generated by steps S20 to S30 of the above-mentioned method of manufacturing flexible display. That is, an inorganic layer 5 is formed on the substrate 1 (S20, FIG. 4B), and the inorganic layer in the bending area of the substrate 1 is etched and is replaced with a first organic layer 2 (S30, FIG. 4A).

Figure 5:
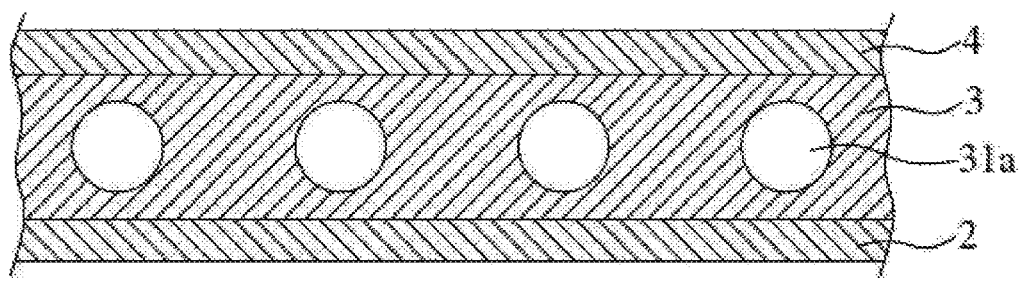
FIG. 5 is a schematic view of a protruding portion of a flexible display according to another embodiment of the present disclosure.
Figure 6:
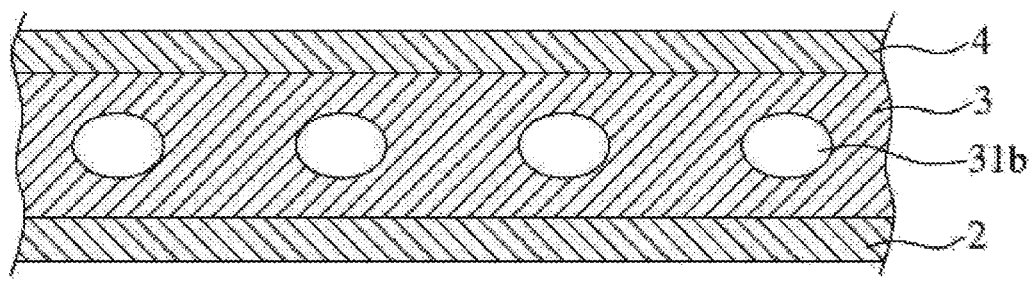
FIG. 6 is a schematic view of a protruding portion of a flexible display according to another embodiment of the present disclosure.
Figure 7:
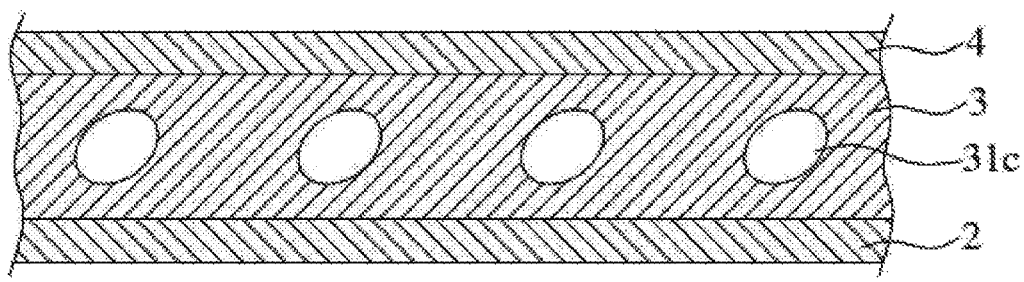
FIG. 7 is a schematic view of a protruding portion of a flexible display according to another embodiment of the present disclosure.

In this embodiment, the protruding portion 31 is square. The present disclosure is not limited to this. In other embodiments, the protrusions may have various shapes. For example, the protruding portion 31a as shown in FIG. 5 is circular, and the protruding portion 31b shown in FIG. 6 is oval. Alternatively, the protrusions have the patterns arranged at different angles, such as the protruding portions 31c as shown in FIG. 7.

In summary, in the method of manufacturing flexible display and the flexible display manufactured by the method of the present disclosure, the hardness of the bending area is decreased by using the organic layer instead of the inorganic layer, so as to reduce the stress during the bending process. Moreover, the second organic layer can protect the metal wiring layer. In addition, a portion of the patterned metal wiring layer protruding from other portions of the patterned metal wiring layer increases the contact area with the second organic layer, thereby reducing the risk of metal wiring peeling and cracking during the bending process.

Although the present application has been disclosed by way of preferred embodiments, the above preferred embodiments are not intended to limit the present disclosure. One of ordinary skill in the art can make various modifications and replacements without departing from the spirit and scope of the present disclosure. Thus, the scope of protection of the present application is defined by the scope of the appended claims.

What is claimed is:

1. A method of manufacturing a flexible display, comprising:
    coating a polyimide solution on a glass and curing the polyimide solution to obtain a substrate, wherein the substrate includes a display area and a bending area;
    forming an inorganic layer on the substrate;
    etching away a part of the inorganic layer in the bending area, and replacing the part of the inorganic layer with a first organic layer;
    forming a metal wiring layer on the first organic layer;
    patterning the metal wiring layer into a wire, wherein the wire has one or more protruding portions, the protruding portions define a surface of the wire away from the substrate, and a surface of the wire close to the substrate is a flat surface; and
    forming a second organic layer covering the wire.

2. The method of manufacturing the flexible display according to claim 1, wherein the protruding portions are protrudingly disposed in the second organic layer.

3. The method of manufacturing the flexible display according to claim 1, wherein the protruding portions are circular, oval, rectangular, square, or rhombic.

4. The method of manufacturing the flexible display according to claim 1, wherein the first organic layer is made of polyimide.

5. The method of manufacturing the flexible display according to claim 1, wherein the second organic layer is made of polyimide.

6. The method of manufacturing the flexible display according to claim 1, wherein a thickness of the first organic layer is 1 to 10 µm.

7. The method of manufacturing the flexible display according to claim 1, wherein a thickness of the second organic layer is 1 to 10 µm.

8. A method of manufacturing a flexible display, comprising:
    providing a substrate, wherein the substrate includes a display area and a bending area;
    forming an inorganic layer on the substrate;
    etching away a part of the inorganic layer in the bending area, and replacing the part of the inorganic layer with a first organic layer;
    forming a metal wiring layer on the first organic layer;
    patterning the metal wiring layer into a wire, wherein the wire has one or more protruding portions, the protruding portions define a surface of the wire away from the substrate, and a surface of the wire close to the substrate is a flat surface; and
    forming a second organic layer covering the wire.

9. The method of manufacturing the flexible display according to claim 8, wherein the protruding portions are protrudingly disposed in the second organic layer.

10. The method of manufacturing the flexible display according to claim 8, wherein the protruding portions are circular, oval, rectangular, square, or rhombic.

11. The method of manufacturing the flexible display according to claim 8, wherein the first organic layer is made of polyimide.

12. The method of manufacturing the flexible display according to claim 8, wherein the second organic layer is made of polyimide.

13. The method of manufacturing the flexible display according to claim 8, wherein a thickness of the first organic layer is 1 to 10 µm.

14. The method of manufacturing the flexible display according to claim 8, wherein a thickness of the second organic layer is 1 to 10 µm.

* * * * *